United States Patent
Son et al.

(10) Patent No.: US 7,385,295 B2
(45) Date of Patent: Jun. 10, 2008

(54) FABRICATION OF NANO-GAP ELECTRODE ARRAYS BY THE CONSTRUCTION AND SELECTIVE CHEMICAL ETCHING OF NANO-CROSSWIRE STACKS

(75) Inventors: Kyung-Ah Son, Moorpark, CA (US); Nicholas Prokopuk, Ridgecrest, CA (US)

(73) Assignees: California Institute of Technology, Pasadena, CA (US); The United States of America as represented by the Secretary of the Navy, Washington, DC (US)

( * ) Notice: Subject to any disclaimer, the term of this patent is extended or adjusted under 35 U.S.C. 154(b) by 330 days.

(21) Appl. No.: 11/141,486

(22) Filed: May 31, 2005

(65) Prior Publication Data

US 2005/0285275 A1    Dec. 29, 2005

Related U.S. Application Data

(60) Provisional application No. 60/582,698, filed on Jun. 24, 2004.

(51) Int. Cl.
*H01L 29/41* (2006.01)
(52) U.S. Cl. .............................. 257/776; 257/E23.143; 438/619
(58) Field of Classification Search ........ 257/E23.143; 438/619; 977/762
See application file for complete search history.

(56) References Cited

U.S. PATENT DOCUMENTS 6,128,214 A   10/2000  Kuekes et al.
6,256,767 B1   7/2001  Kuekes et al.
6,432,740 B1   8/2002  Chen
2002/0130353 A1*  9/2002  Lieber et al. ............... 257/315

OTHER PUBLICATIONS

Reed MA, Zhou C, Muller CJ, Burgin TP, Tour JM, "Conductance of a molecular junction", Science 278 (5336); 252-254 Oct. 10, 1997.

Park H, Lim AKL, Alivisatos AP, Park J, McEuen PL, "Fabrication of metallic electrodes with nanometer separation by electromigration" Applied Physics Letters, 75 (2); 301-303 Jul. 12, 1999.

Morpurgo AF, Marcus CM, Robinson DB, "Controlled fabrication of metallic electrodes with atomic separation", Applied Physics Letters, 74 (14); 2094-2086 Apr. 5, 1999.

(Continued)

*Primary Examiner*—Stephen W Smoot
(74) *Attorney, Agent, or Firm*—Joseph B. Milstein; Hiscock & Barclay, LLP

(57) ABSTRACT

Methods of fabricating nano-gap electrode structures in array configurations, and the structures so produced. The fabrication method involves depositing first and second pluralities of electrodes comprising nanowires using processes such as lithography, deposition of metals, lift-off processes, and chemical etching that can be performed using conventional processing tools applicable to electronic materials processing. The gap spacing in the nano-gap electrode array is defined by the thickness of a sacrificial spacer layer that is deposited between the first and second pluralities of electrodes. The sacrificial spacer layer is removed by etching, thereby leaving a structure in which the distance between pairs of electrodes is substantially equal to the thickness of the sacrificial spacer layer. Electrode arrays with gaps measured in units of nanometers are produced. In one embodiment, the first and second pluralities of electrodes are aligned in mutually orthogonal orientations.

25 Claims, 10 Drawing Sheets

OTHER PUBLICATIONS

Lefebvre J, Radosavljevic M, Johnson AT, "Fabrication of nanometer size gaps in metallic wire", Applied Physics Letters, 76 (25); 3828-3830 Jun. 19, 2000.

Nagase T, Kubota T, Mashiko S, "Fabrication of nano-gap electrodes fro measuring electrical propoerties of organic molecules using a focused ion beam", Thin Solid Films, 438; 374-377, Aug. 22, 2003.

Saifullah MSM, Ondarcuhu T, Koltsov DK, Joachim C, Welland ME, "A relieable scheme for fabricating sub-5 nm co-planar junctions for single-molecule electronics", Nanotechnology, 13 (5); 659-662, Oct. 2002.

Liu K, Avouris P, Bucchignano J, Martel R, Sun S, Michl J, "Simple fabrication scheme for sub-10 nm electrode gaps using electron-beam lithography", Applied Physics Letter, 80 (5); 865-867, Feb. 4, 2002.

* cited by examiner

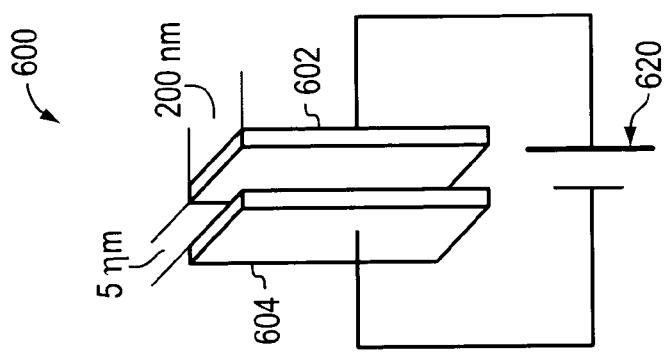
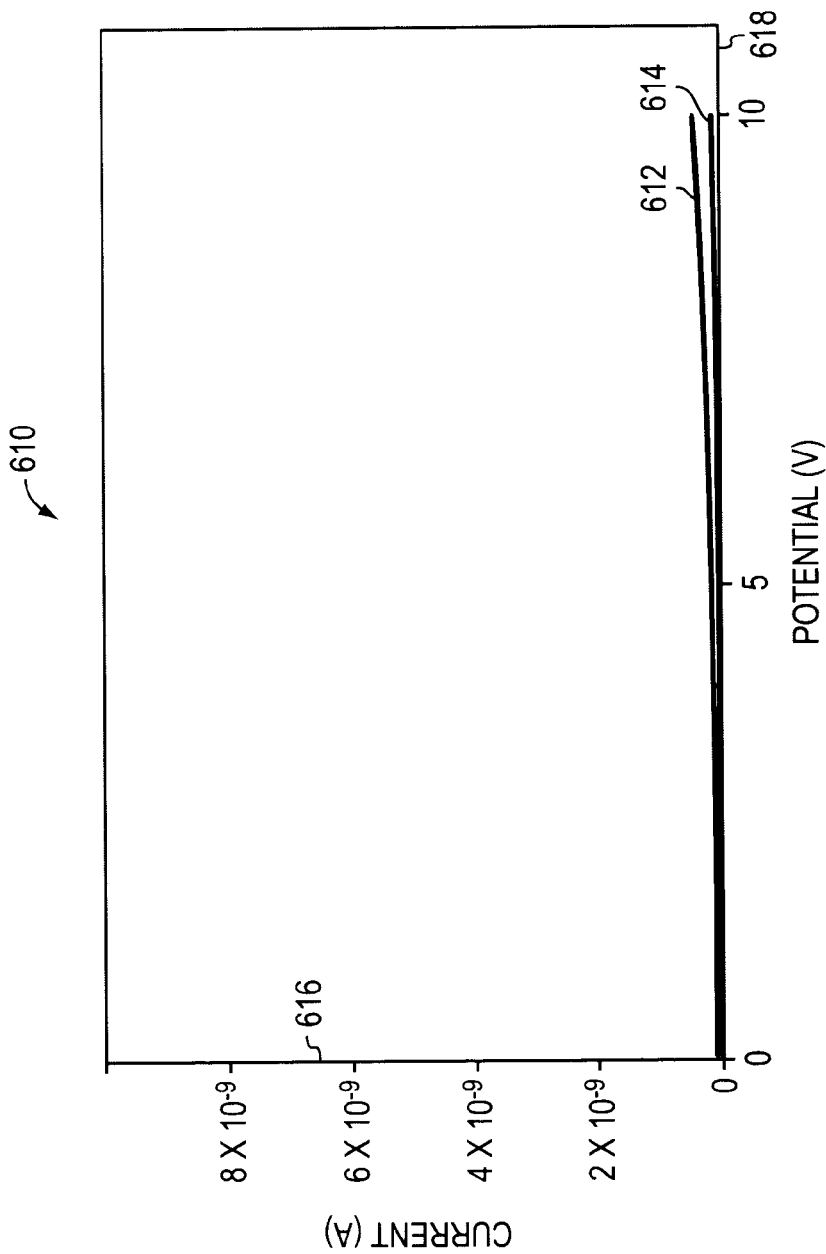
FIG. 6A
FIG. 6B

FABRICATION OF NANO-GAP ELECTRODE ARRAYS BY THE CONSTRUCTION AND SELECTIVE CHEMICAL ETCHING OF NANO-CROSSWIRE STACKS

CROSS-REFERENCE TO RELATED APPLICATIONS

This application claims priority to and the benefit of co-pending U.S. provisional patent application Ser. No. 60/582,698, filed Jun. 24, 2004, which application is incorporated herein by reference in its entirety.

STATEMENT REGARDING FEDERALLY FUNDED RESEARCH OR DEVELOPMENT

The invention described herein was made in the performance of work under a NASA contract, and is subject to the provisions of Public Law 96-517 (35 USC 202) in which the Contractor has elected to retain title.

FIELD OF THE INVENTION

The invention relates to electrode arrays in general and particularly to electrode arrays having gaps with dimensions in the range of units to tens of nanometers.

BACKGROUND OF THE INVENTION

Fabrication of conductive electrodes with molecular sized separations is required for the electrical characterization of single molecules. Electrical characterization of single molecules in turn is essential for the development of single molecular electronic devices, including chemical and biological sensors. Several methods have been demonstrated to fabricate electrodes having gap dimensions measured in units or tens of nanometers (which are also referred to as "nano-gap electrodes"). The methods include: fabrication of thin wires comprising mechanical break junctions; electromigration of metal to cause a break in a wire; electrochemical deposition techniques on planar substrates; shadow evaporation of metals onto planar substrates; focused ion beam etching of metallic structures on planar substrates; and e-beam lithography of metallic structure on planar substrates. Most of these approaches are, however, not easily controllable and suffer poor reproducibility, low yield, and low throughput. The e-beam lithography method is relatively controllable and reproducible. However well-controlled creation of <10 nm gap electrodes was achieved only by using elaborate e-beam overlapping and overexposure lithography techniques. The focused ion beam method can generate <10 nm gap electrodes using Ti mask patterns with focused ion beam etching. However focused ion beam systems are not readily available due to the extremely high cost of the apparatus used to generate such beams. Furthermore, all these previously demonstrated methods are not suitable for producing highly dense nanoelectrode arrays that are electrically addressable for chemical and biological sensor applications.

There is a need for highly dense nano-gap electrode array structures that are electrically addressable for chemical and biological sensor applications and for methods of fabricating such nano-gap electrode arrays.

SUMMARY OF THE INVENTION

We describe a new approach to fabricate nano-gap electrode structures in array configuration. As opposed to previously demonstrated methods, this approach is simple, easy to control, and enables the production of electrically addressable, ultra dense, nano-gap electrode arrays. In overview, the fabrication method involves depositing a first plurality of first electrodes and a second plurality of second electrodes using processes such as lithography, deposition of metals, lift-off processes, and chemical etching that can be performed using processing tools such as are used in processing electronic materials. The gap spacing in the nano-gap electrode array is defined by the thickness of a sacrificial spacer layer that is deposited between the first plurality of first electrodes and the second plurality of second electrodes, and that is removed by etching, thereby leaving a structure in which the distance between pairs of electrodes is substantially equal to the thickness of the sacrificial spacer layer.

In one aspect, the invention relates to a method of fabricating a nano-gap electrode structure in an array configuration. The method comprises the steps of forming a first plurality of first electrodes in an array, each of the plurality of first electrodes having a first electrode surface; depositing a sacrificial spacer layer having a first surface and a second surface defining a thickness of the sacrificial spacer layer upon the first electrode surface of at least one of the first electrodes, the first surface of the sacrificial spacer layer adjacent the first electrode surface of the first electrode; forming a second plurality of second electrodes in an array, each of the plurality of second electrodes having a first electrode surface, the second surface of the sacrificial spacer layer adjacent the first surface of at least one of the second plurality of second electrodes; and removing at least that portion of the sacrificial spacer layer having the first surface of the sacrificial spacer layer adjacent the first electrode surface of a selected one of the first plurality of first electrodes and the second surface of the sacrificial spacer layer adjacent the first surface of at least one of the second plurality of second electrodes. The first surface of the selected one of the first plurality of first electrodes and the first surface of at least one of the second plurality of second electrodes define an electrode gap having a dimension substantially equal to the thickness of the portion of the sacrificial spacer layer that was removed.

In one embodiment, the method further comprises the step of providing a substrate for supporting the nano-gap electrode structure.

In one embodiment, the method further comprises the step of providing a first adhesion layer between the substrate and at least one of the first plurality of first electrodes. In one embodiment, the first adhesion layer and the sacrificial spacer layer comprise a different material composition. In one embodiment, the substrate is a semiconductor material. In one embodiment, the semiconductor material is silicon.

In one embodiment, the method further comprises the step of providing an insulator layer upon the substrate for electrically insulating at least one electrode of the nano-gap electrode structure from the substrate.

In one embodiment, the method further comprises the step of defining a dimension of at least one of the first plurality of first electrodes in an array and the second plurality of second electrodes in an array by lithographic methods. In one embodiment, the dimension is a selected one of a width of a selected electrode, a separation between two adjacent electrodes in the first plurality of first electrodes, and a separation between two adjacent electrodes in the second plurality of second electrodes.

In one embodiment, the method further comprises the step of defining a relative orientation between at least one of the first plurality of first electrodes in an array and at least one of the second plurality of second electrodes in an array by lithographic methods. In one embodiment, the relative orientation is an orthogonal orientation.

In one embodiment, the method further comprises the step of forming a lattice structure that mechanically supports at least one of the first plurality of first electrodes and the second plurality of second electrodes.

In one embodiment, the method further comprises the step of providing electrical connection contacts connected to the first plurality of first electrodes and the second plurality of second electrodes, the electrical connection contacts configured to provide convenient electrical communication between the nano-gap electrode structure and another electrical device. In one embodiment, the thickness of the sarificial spacer layer is less than ten nanometers.

In another aspect the invention features a three-dimensional nano-gap electrode structure in an array configuration. The three-dimensional nano-gap electrode structure comprises a first plurality of first electrodes in an array, each of the plurality of first electrodes having a first electrode surface; and a second plurality of second electrodes in an array, each of the plurality of second electrodes having a first electrode surface, a first surface of at least one of the first plurality of first electrodes disposed at a separation distance from the first electrode surface of a selected one of the second plurality of second electrodes, the separation distance defined by a void resulting from removal of a sacrificial material, the separation distance being measured in a direction perpendicular to at least one of the first electrode surface of the first electrode and the first electrode surface of the second electrode. The first surface of the selected one of the first plurality of first electrodes and the first surface of at least one of the second plurality of second electrodes define a three-dimensional structure.

In one embodiment, the separation distance has a dimension of less than 10 nm.

In one embodiment, the three-dimensional nano-gap electrode structure in an array configuration further comprises a substrate for supporting the three dimensional nano-gap electrode structure. In one embodiment, the substrate is a semiconductor material. In one embodiment, the semiconductor material is silicon.

In one embodiment, the three-dimensional nano-gap electrode structure in an array configuration further comprises an insulator layer upon the substrate for electrically insulating at least one electrode of the nano-gap electrode structure from the substrate.

In one embodiment, the three-dimensional nano-gap electrode structure in an array configuration further comprises electrical connection contacts connected to the first plurality of first electrodes and the second plurality of second electrodes, the electrical connection contacts configured to provide convenient electrical communication between the nano-gap electrode structure and another electrical device.

In one embodiment, the three-dimensional nano-gap electrode structure in an array configuration further comprises a lattice structure that mechanically supports at least one of the first plurality of first electrodes and the second plurality of second electrodes. In one embodiment, at least one of the first plurality of first electrodes in an array and at least one of the second plurality of second electrodes in an array are disposed relative to one another in an orthogonal orientation.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIG. 5($d$) is a scanning electron microscope (SEM) image at low magnification, showing a region of a nano-gap electrode array structure comprising a first plurality of first electrodes and a second plurality of second electrodes in mutually orthogonal orientation, according to principles of the invention.

FIGS. 6($b$) and 6($c$) are graphs of the current normally observed, and anomalous current observed, to flow across the electrode pair as a function of applied voltage when tested using a circuit such as that of FIG. 6($a$), with no electrically active substance deliberately placed in the 5 nm gap, respectively.

DETAILED DESCRIPTION OF THE INVENTION

One application of a nano-gap electrode array structure is to provide a primary detection element for a chemical and/or a biomolecular microsensor having ultra high sensitivity. The nano-electrode based microsensor is expected to have numerous applications for NASA missions including in situ detection of signatures of extraterrestrial life during planetary exploration, and health and habitat environmental monitoring for astronauts during manned missions, as well as applications in chemical and biomolecular sensing in a terrestrial environment.

In one embodiment, nano-gap electrode arrays are fabricated by creating two crossed overlapping layers of electrodes in an array configuration that are separated by a sacrificial spacer layer such as an ultra thin (<10 nm) film (e.g. Cr, Ge, or Ni) and then selectively etching away the sacrificial spacer layer to provide a gap of desired dimensions between the electrodes. In the final structure, the crossed nanowires form nanoelectrode pairs with the gap between the pair of electrodes determined by the thickness of the sacrificial spacer layer. In some embodiments, the electrode arrays comprise nanowire arrays. The nanowires can be any convenient size that is sufficient to carry the necessary electrical signals, for example, for sensing a chemical or biological sample situated in the nano-gap of an electrode pair. As will be apparent from the description and the drawings, it is possible to individually address an electrode pair by activating (e.g., applying sensing signals to, and receiving data signals from) the nanowires used to form the electrode pair. Although the nanowires described herein are generally substantially rectangular in cross section, nanowires having any convenient geometrical cross section can in principle be used.

The fabrication process can be understood in its most general description as the steps of forming the first layer comprising a first plurality of nanowire electrodes, depositing the sacrificial spacer layer upon the first layer of electrodes, forming a second layer comprising a second plurality of nanowire electrodes upon the sacrificial spacer layer, and removing the sacrificial spacer layer to provide nano-gaps between pairs of nanowire electrodes in the first and second layers. The nanowire electrodes of the first and second layers are deposited so that they are aligned relative to one another at an angle different from zero degrees. In the embodiment depicted in the present disclosure, the nanowires of the first layer are oriented in an orthogonal direction to the nanowires of the second layer, but in principle, the nanowire electrodes of the first and second layers can be deposited so that they are aligned relative to one another at any angle different from zero degrees so as to form an array of crossed electrodes forming electrode pairs that can be individually addressed.

Figure 1:
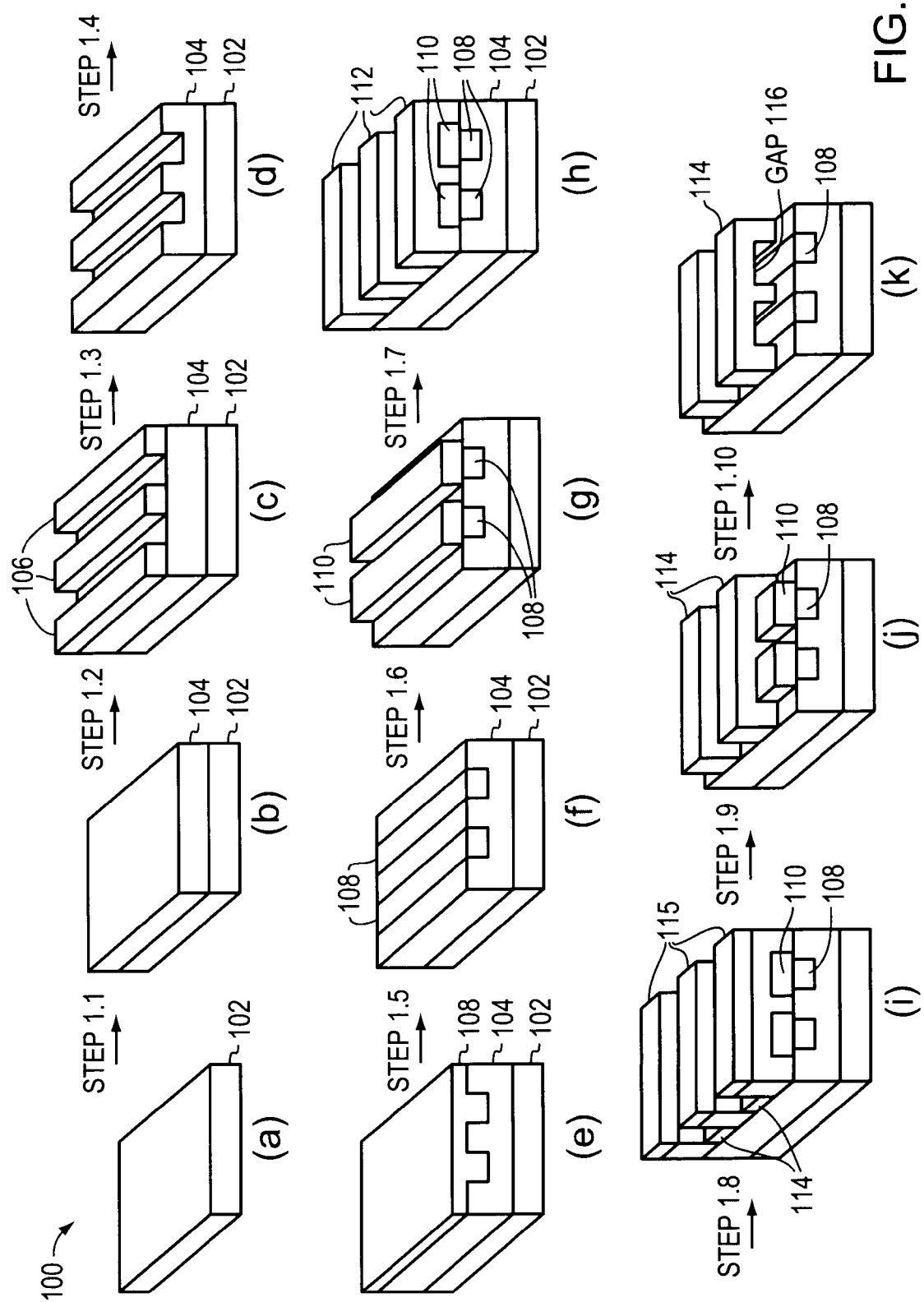
FIG. 1 is a schematic flow diagram depicting the steps of a first fabrication process for producing a nano-gap electrode array structure, in which FIGS. 1($a$)-1($k$) are perspective views depicting the structure of the nano-gap electrode array as it is formed stepwise in the depicted process, according to the invention.

FIG. 1 is a schematic flow diagram 100 depicting the steps of a first fabrication process for producing a nano-gap electrode array structure, in which FIGS. 1(a)-1(k) are perspective views depicting the structure of the nano-gap electrode array as it is formed stepwise in the depicted process.

In FIG. 1(a), there is shown a substrate 102, such as a silicon wafer that can have a thermal oxide layer on an upper surface thereof. Other substrate materials can in principle be used, such as other semiconductors, insulators such as glass or quartz, or metals (possibly covered with a thin insulating layer to allow individual electrode nanowires to be electrically isolated from other nanowires, for example, aluminum (Al) having an oxide coating). It is in principle possible to use as a substrate a processed silicon wafer having circuitry present thereon (or therein). Such a wafer, after being processed according to the principles of the invention, may provide both a nano-gap electrode array structure, and circuitry useful to process signals from the nano-gap electrode array structure and/or to control the operation of the nano-gap electrode array structure.

At step 1.1, a thin silicon oxide film 104 is grown on the silicon wafer 102, using convention thermal oxidation methods or other thin film deposition methods (e.g., chemical vapor deposition methods and sputter deposition methods). In principle, other insulator layers, such as silicon nitride ($Si_3N_4$) can also be deposited in place of thermally grown silicon dioxide. FIG. 1(b) shows a schematic of a silicon wafer 102 with a thermal oxide layer 104. The thin thermal oxide film or layer 104 provides electrical isolation between pairs of nanowires and between the nanowires and the silicon wafer substrate 102.

At step 1.2, a layer of resist 106 is applied over the oxide layer 104 using conventional processing methods, and the resist 106 is patterned using e-beam lithography to create a template for the first nanowire layer. The lithographic patterning allows one to control the dimension of a width, a length and a thickness of a nanowire electrode, and the spacing between one nanowire electrode and an adjacent nanowire electrode in an electrode array. The maximum thickness of the nanowire is determined by the thickness of the metal film that is deposited. However, the thickness and profile of the resist layer may limit the film thickness that one can deposit and still define the geometry of the nanowire. FIG. 1(c) depicts a silicon wafer 102 having an oxide layer 104 upon which is a patterned resist layer 106.

At step 1.3, an etching process is used to remove a portion of the oxide layer in conformity with the patterned resist 106, to form grooves that will hold electrode metal. The etching process in one embodiment is a reactive ion etching process, but any suitable etching process can be applied to remove oxide in conformity with the patterned resist. FIG. 1(d) depicts the silicon wafer with the patterned oxide layer 104.

At step 1.4, one or more deposition processes are used to deposit a metallic film 108, such as gold (Au) or platinum (Pt) that will be patterned to form a first plurality of nanowires in an electrode array. Optionally, the step 1.4 includes the deposition of an adhesion layer, such as a thin layer of titanium metal (Ti) prior to the deposition of the gold or platinum, whereas metals such as Ni, Mo, Cu, and Al do not require an adhesion layer when deposited on a substrate such as silicon having a thermal oxide grown thereon. In some embodiments, e-beam evaporation is used to deposit the Au film 108 with an adhesion layer. FIG. 1(e) depicts the structure after the metal film 108 has been deposited.

Optionally, at step 1.5, chemical and mechanical polishing techniques are applied to the metal surface in order to remove any over-deposited metal and to make the surface flat for the fabrication of the second layer. FIG. 1(f) shows the structure of the first plurality of first electrodes 108 in an array on the substrate.

At step 1.6, a sacrificial spacer layer 110 (e.g., a layer defining the separation thickness or nano-gap between electrodes in a pair of electrodes), such as an ultra thin metal film, is deposited and is patterned to cover the nanowires 108 in the first plurality of first electrodes individually. In some embodiments, the sacrificial spacer layer 110 comprises the same material that is present in an optional adhesion layer for the second plurality of second electrodes (114), for example chromium (Cr). In some embodiments, the sacrificial spacer layer 110 comprises a different material, such as nickel (Ni) or germanium (Ge), than is present in an adhesion layer. The sacrificial spacer layer 110 has a bottom surface and a top surface as shown for example in FIG. 1(g). The distance between the top and bottom surfaces defines a thickness of the sacrificial spacer layer 110. In various embodiments, the thickness of the sacrificial spacer layer 110 can be as thin as one or two atomic layers (less than 1 nanometer, or 10 angstroms) to dimensions of tens of nanometers. While it is possible to deposit one or two atomic layers of the film, it is generally a good idea to deposit at least a few atomic layers to ensure the formation of a continuous film. In some embodiments, sacrificial spacer layers 110 having thicknesses of less than 10 nanometers (nm) have been fabricated. As already indicated, there are applications for which a sacrificial spacer layer having a thickness dimension below 10 nm is desirable, such as for single molecular detection. However, it should be understood that sacrificial spacer layers having thicknesses measured in microns have also been produced, and may be useful in other applications, such as biological applications where structures having dimensions larger than 10 nanometers may be of interest. FIG. 1(g) depicts the structure of the ultra thin sacrificial spacer layer 110 deposited over electrode nanowires 108, so that the sacrificial spacer layer 110 extends somewhat beyond the width dimension of the nanowires 108, for example to prevent the next layer comprising the second plurality of second electrode nanowires from contacting the first plurality of first electrode nanowires.

Using a combination of e-beam lithography and e-beam deposition of Au film with an adhesion layer, a second nanowire layer is created crosswise to the first layer. At step 1.7, a second resist layer 112 is applied to the structure and is patterned, for example using electron beam lithography. As shown in FIG. 1(h), in one embodiment, the length dimension in the lithographic pattern that defines the second plurality of nanowires is orthogonal to the length dimension of the first plurality of nanowires.

At step 1.8, in a manner similar to step 1.4, metal (such as gold) is deposited (optionally with an adhesion layer), to form a second plurality of second electrode nanowires in an array. FIG. 1(i) depicts the deposition of metal 114 over the substrate oxide 104 and sacrificial spacer layers 110, and additionally, deposited (but unnecessary) metal 115 over the patterned resist 112.

At step 1.9, a lift-off process is used to remove the resist 112 and the metal 115 that was deposited on top of the resist 112, leaving the second plurality of nanowire electrodes 114 in an array, as shown in FIG. 1(j).

At step 1.10, the sacrificial spacer layers 110 (for example, Cr, Ge, or Ni) are removed in an etching process, for example with wet chemical etchant, and the resultant nanowire stack is rinsed with deionized water and optionally dried in a $CO_2$ critical point drier. In one embodiment, the sarificial spacer layer does not comprise the same material as the adhesion layer for the first polarity of electrode array, in order to insure that the adhesion layer is not dissolved during the removal of the sarificial spacer layers. The final structure that results is depicted in FIG. 1(k) in which a gap 116 can be discerned between surfaces of individual wires 108 and 114 in the first and second pluralities of electrodes in array configuration. The gap 116 is a separation distance between surfaces of the individual nanowires 108 and 114 in the first and second pluralities of electrodes. The dimension of the gap 116 is defined by the thickness of the sacrificial spacer layer 110, which can be controlled when the sacrificial spacer layer 110 is deposited. To the extent that the sacrificial spacer layer 110 is uniform in thickness, the gaps 116 between surfaces of different pairs of nanowires 108, 114 in the first and second pluralities of electrodes will be uniform or constant.

Figure 2:
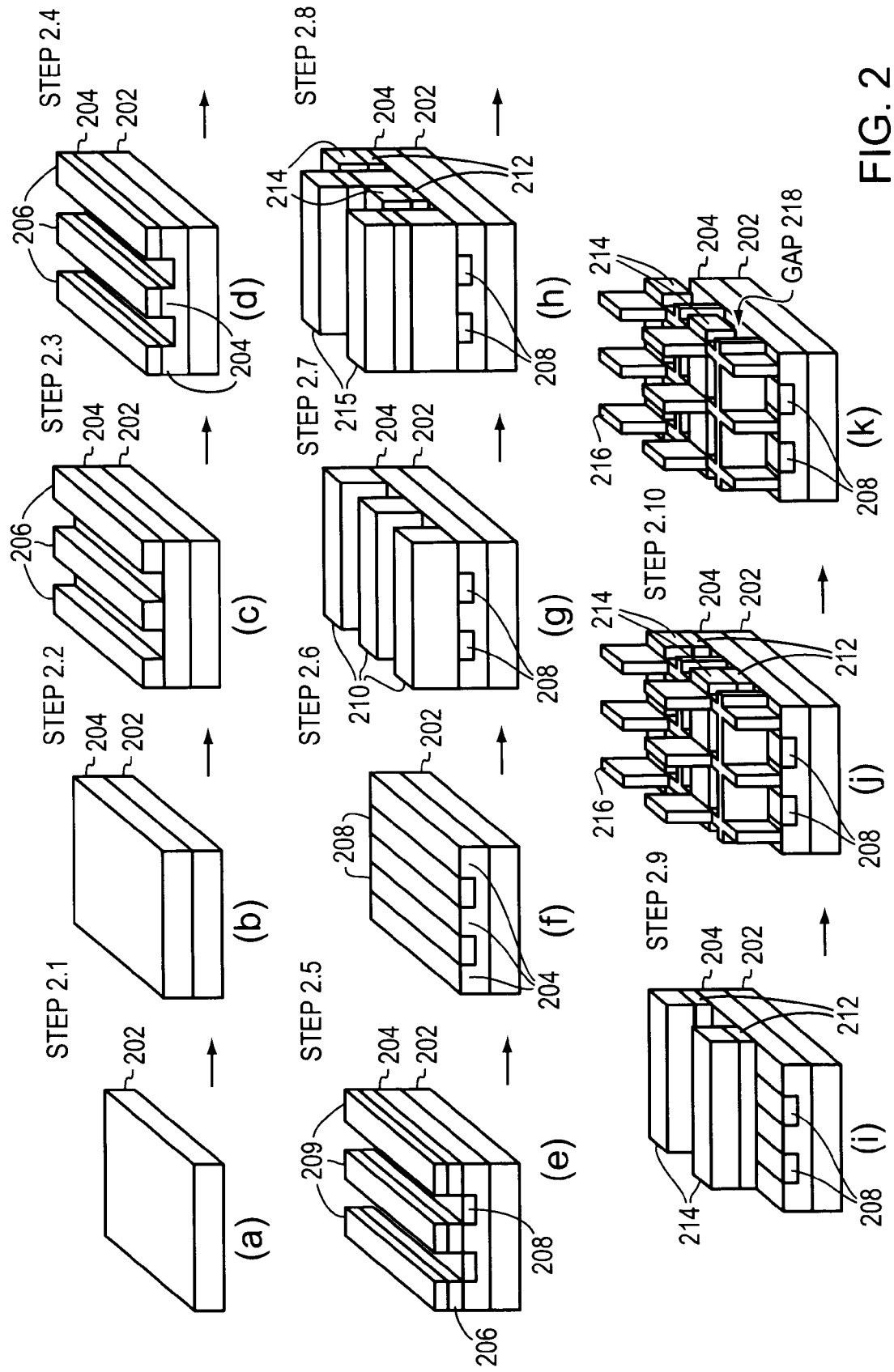
FIG. 2 is a schematic flow diagram depicting the steps of a second fabrication process for producing a nano-gap electrode array structure, in which FIGS. 2($a$)-2($k$) are perspective views depicting the structure of the nano-gap electrode array as it is formed stepwise in the depicted process, according to the invention.

FIG. 2 is a schematic flow diagram 200 depicting the steps of a second fabrication process for producing a nano-gap electrode array structure, in which FIGS. 2(a)-2(k) are perspective views depicting the structure of the nano-gap electrode array as it is formed stepwise in the depicted process.

In FIG. 2(a), there is shown a substrate 202, such as a silicon wafer that can have an insulator layer on an upper surface thereof. Other substrate materials can in principle be used, such as other semiconductors, insulators such as glass or quartz, or metals (possibly covered with a thin insulating layer to allow individual electrode nanowires to be electrically isolated from other nanowires, for example, aluminum (Al) having an oxide coating). It is in principle possible to use as a substrate a processed silicon wafer having circuitry present thereon (or therein). Such a wafer, after being processed according to the principles of the invention, may provide both a nano-gap electrode array structure, and circuitry useful to process signals from the nano-gap electrode array structure and/or to control the operation of the nano-gap electrode array structure.

At step 2.1, a thin dielectric or insulator film 204 is grown on the silicon wafer 202. In some embodiments the thin insulator film 204 comprises silicon oxide ($SiO_2$) or silicon nitride ($Si_3N_4$), which can be prepared using convention thermal oxidation methods or by reacting the silicon with ammonia or other nitrogen-bearing substance, for example, in a plasma system, to grow the oxide or nitride, respectively. Thin insulator films also can be grown using conventional thin film growth methods such as LPCVD (low pressure chemical vapor deposition), or PECVD (plasma enhanced chemical vapor deposition). In principle, other insulator layers can also be deposited in place of thermally grown silicon dioxide or silicon nitride. FIG. 2(b) shows a schematic of a silicon wafer 202 with an insulator layer 204. The thin insulator layer 204 provides electrical isolation between pairs of nanowires and between the nanowires and the silicon wafer substrate 202.

At step 2.2, a layer of resist 206 is applied over the insulator layer 204 using conventional processing methods, and the resist 206 is patterned using e-beam lithography to create a template for the first nanowire layer. The lithographic patterning allows one to control the dimension of a width, a length, and a thickness of a nanowire electrode, and the spacing between one nanowire electrode and an adjacent nanowire electrode in an electrode array. FIG. 2(c) depicts a silicon wafer 202 having an insulator layer 204 upon which is a patterned resist layer 206.

At step 2.3, an etching process is used to remove a portion of the insulator layer is conformity with the patterned resist 206, to form grooves that will hold electrode metal. The etching process in one embodiment is a reactive ion etching process, but any suitable etching process that can be applied to remove some of the insulator in conformity with the patterned resist can in principle be used. The masking material for the etching can be an e-beam resist or a metallic film, e.g., Cr or Al. If a metal film is used as a mask, it preferably should be deposited directly on the insulator surface, for example using e-beam evaporation, and then patterned, for example with electron beam lithography. Reactive ion etching followed by the removal of the mask material will result in the grooves or molds for the nanowires, which can be fabricated using Au, Pt, or other suitably conductive and unreactive metals, possibly with the use of an adhesion layer. The purpose of the step of defining grooves or molds is to make a planar surface for fabrication of the second layer nanowire array described hereinafter. One can optionally omit this fabrication step if one is willing to obtain nanowires in the second array that have humps, as will be explained with regard to FIG. 3 hereinbelow. FIG. 2(d) depicts the silicon wafer with the patterned insulator layer 204 having resist 206 present over portions of the unetched insulator 204.

At step 2.4, one or more deposition processes are used to deposit a metallic film 208, such as gold (Au) or platinum (Pt) that will be patterned to form a first plurality of nanowires in an electrode array. Optionally, the step 2.4 includes the deposition of an adhesion layer, such as a thin layer of titanium metal (Ti) prior to the deposition of the gold or platinum, whereas metals such as Ni, Mo, Cu and Al do not require an adhesion layer when deposited on a substrate such as silicon having a thermal oxide grown thereon. In some embodiments, e-beam evaporation is used to deposit the Au film 208 with an adhesion layer. Excess metal 209 may overcoat portions of the resist 206 in the course or performing the one or more deposition processes. FIG. 2(*e*) depicts the structure after the metal film 208, 209 has been deposited.

At step 2.5, a lift-off process, for example using acetone, is used in order to remove a soluble resist 206 and any overcoated metal 209 including adhesion layers, if any, leaving in place the first layer 208 of the nanowire array. The thickness of the Au nanowire is controlled, for example, making it equal to the depth of the molds. However, mechanical polishing can be applied to make the surface flat, prior to fabrication of the second layer of the nanowire arrays. FIG. 2(*f*) shows the structure of the first plurality of first electrodes 208 in an array on the substrate.

At step 2.6, an e-beam patterned resist 210 is provided for use in metal deposition to fabricate the second plurality of nanowires. FIG. 2(*g*) depicts the structure of the e-beam patterned resist 210 deposited over the first plurality of first electrode nanowires 208.

At step 2.7, a second plurality of second electrodes in an array configuration is deposited. A different (second) adhesion layer material (for example, Cr, Ge, or Ni) is used for the second array of nanowires 214 than was used for that of the first nanowire array 208. The nanowires in the second plurality of second electrodes can comprise Au, Pt, or other suitably conductive and unreactive metals. The adhesion layer for the second array of nanowires 214 will be removed in the final step (that is, the second adhesion layer is also the sacrificial spacer layer 212) and its thickness will determine the vertical gap 218 at the cross junctions between the first plurality of first electrodes 208 in an array configuration and the second plurality of second electrodes 214 in an array configuration. The thickness of the adhesion layer (or sacrificial spacer layer 212), and consequently, the dimension of the gap 218, can be controlled precisely in nanometer scale using ultra thin film growth methods (e.g., electron beam evaporation or sputter deposition). FIG. 2((*h*) depicts the deposited adhesion/sacrificial spacer layer 212 and the second plurality of second electrodes in an array 214, as well as adhesion layer material and excess electrode metal 215 that will be removed during the lift-off process. The sacrificial spacer layer 212 has a bottom surface and a top surface as shown in FIG. 2(*h*). In various embodiments, the thickness of the sacrificial spacer layer 212 can be as thin as one or two atomic layers (less than 1 nanometer, or 10 angstroms) to dimensions of tens of nanometers. While it is possible to deposit one or two atomic layers of the film, it is generally a good idea to deposit at least a few atomic layers to ensure the formation of a continuous film. In some embodiments, sacrificial spacer layers 212 having thicknesses of less than 10 nanometers (nm) have been fabricated. As shown in FIG. 2(*h*), in one embodiment, the length dimension in the lithographic pattern that defines the second plurality of nanowires 214 is orthogonal to the length direction of the first plurality of nanowires 208.

At step 2.8, a lift-off process is used to remove the resist 210 along with the adhesion layer 212 and the metal 215 that was deposited on top of the resist 210, including adhesion layers, if any, leaving the second plurality of second electrode nanowires 214 in an array, as shown in FIG. 2(*i*).

At step 2.9, an anchor mesh 216 is created over the nanowire arrays using an electrically insulating material (e.g., silicon monoxide SiO) in order to secure the nanowire structure. The patterns for the mesh 216 are created using lithography. The anchor mesh 216 structure is created by thin film deposition of an electrically insulating material (in one embodiment, thermal evaporation of silicon monoxide) followed by a lift-off process in a solvent (in one embodiment, acetone). FIG. 2(*j*) depicts the lattice structure holding the second plurality of second electrode nanowires 214.

At step 2.10, the sacrificial spacer layers 212 are removed in an etching process. The etching process can be a wet or dry chemical etching process (depending on the material to be removed) leaving the nanowire frame 214 holding the second plurality of second electrode nanowires 214 in the proper positions in the absence of the sacrificial spacer layers 212. The final structure that results is depicted in FIG. 2(*k*) in which a gap 218 can be discerned between surfaces of individual wires 208 and 214 in the first and second pluralities of electrodes in array configuration. The gap 218 is a separation distance between surfaces of the individual nanowires 208 and 214 in the first and second pluralities of electrodes. The dimension of the gap 218 is defined by the thickness of the sacrificial spacer layer 212. To the extent that the sacrificial spacer layer 212 is uniform in thickness, the gaps 218 between surfaces of different pairs of nanowires 208, 214 in the first and second pluralities of electrodes will be uniform or constant.

Figure 3:
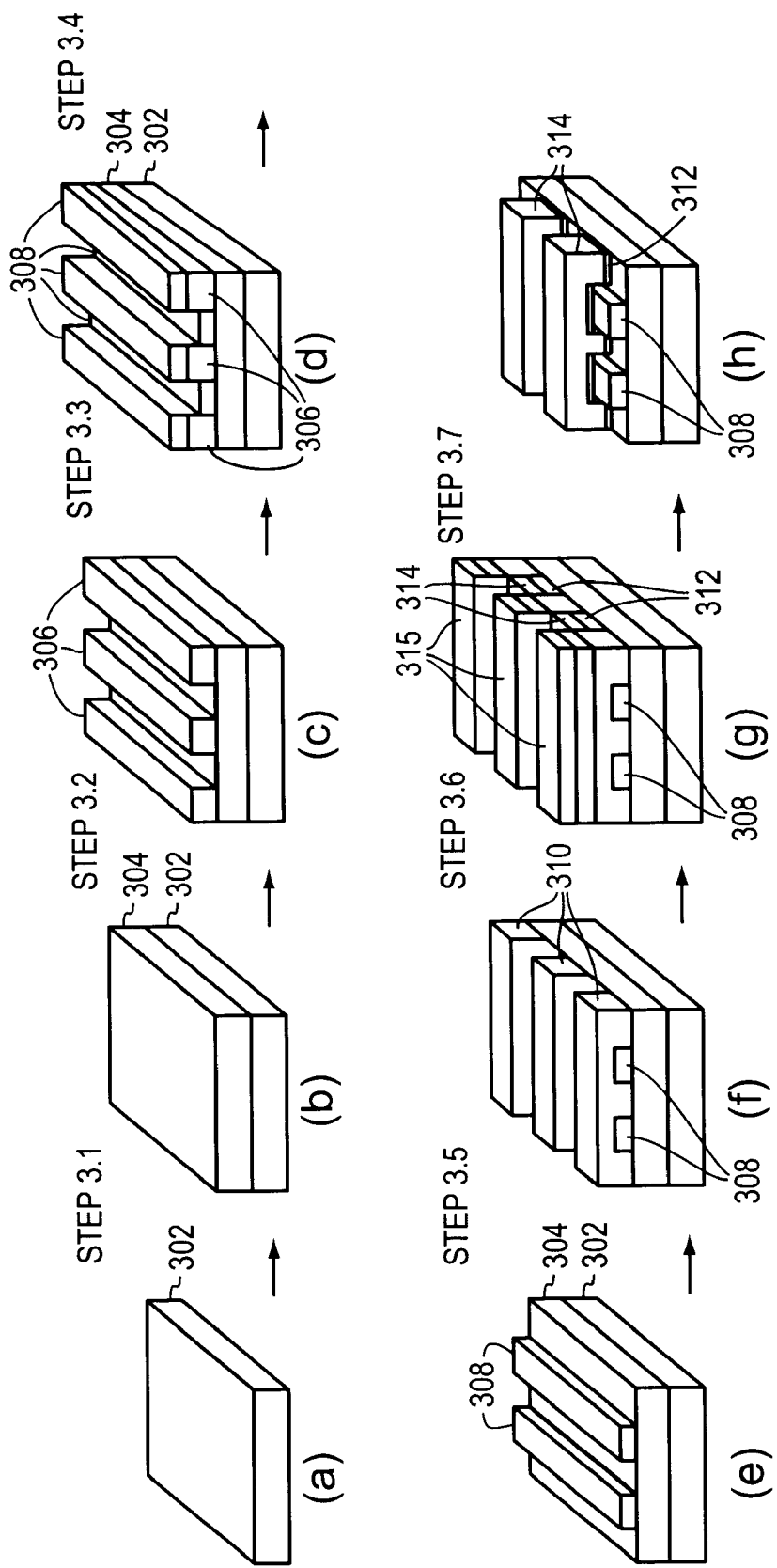
FIG. 3 is a schematic flow diagram depicting the steps of a third fabrication process for producing a nano-gap electrode array structure, in which FIGS. 3($a$)-3($h$) are perspective views depicting the structure of the nano-gap electrode array as it is formed stepwise in the depicted process, according to the invention.

In yet another process for producing a nano-gap electrode array structure, the first plurality of first electrodes in an array can be fabricated on a flat dielectric layer without forming grooves or molds for nanowires, as shown and described with regard to FIG. 3. FIG. 3 is a schematic flow diagram depicting the steps of a third fabrication process for producing a nano-gap electrode array structure, in which FIGS. 3(*a*)-3(*h*) are perspective views depicting the structure of the nano-gap electrode array as it is formed stepwise in the depicted process. This process produces humped wires or electrodes in the second plurality of second electrodes in an array configuration.

In FIG. 3(*a*), there is shown a substrate 302, such as a silicon wafer that can have an insulator layer on an upper surface thereof. Other substrate materials can in principle be used, such as other semiconductors, insulators such as glass or quartz, or metals (possibly covered with a thin insulating layer to allow individual electrode nanowires to be electrically isolated from other nanowires, for example, aluminum (Al) having an oxide coating). It is in principle possible to use as a substrate a processed silicon wafer having circuitry present thereon (or therein). Such a wafer, after being processed according to the principles of the invention, may provide both a nano-gap electrode array structure, and circuitry useful to process signals from the nano-gap electrode array structure and/or to control the operation of the nano-gap electrode array structure.

At step 3.1, a thin dielectric or insulator film 304 is grown on the silicon wafer 302. In some embodiments the thin insulator film 304 comprises silicon oxide ($SiO_2$) or silicon nitride ($Si_3N_4$), which can be prepared using convention thermal oxidation methods or by reacting the silicon with ammonia or other nitrogen-bearing substance, for example, in a plasma system, to grow the oxide or nitride, respectively. Thin insulator films also can be grown using conventional thin film growth methods such as LPCVD (low pressure chemical vapor deposition), or PECVD (plasma enhanced chemical vapor deposition). In principle, other insulator layers can also be deposited in place of thermally grown silicon dioxide or silicon nitride. FIG. 3(b) shows a schematic of a silicon wafer 302 with an insulator layer 304. The thin insulator layer 304 provides electrical isolation between pairs of nanowires and between the nanowires and the silicon wafer substrate 302.

At step 3.2, a layer of resist 306 is applied over the insulator layer 304 using conventional processing methods, and the resist 306 is patterned using e-beam lithography to create a template for the first nanowire layer. The lithographic patterning allows one to control the dimension of a width, a length, and a thickness of a nanowire electrode, and the spacing between one nanowire electrode and an adjacent nanowire electrode in an electrode array. FIG. 3(c) depicts a silicon wafer 302 having an insulator layer 304 upon which is a patterned resist layer 306.

At step 3.3, one or more deposition processes are used to deposit a metallic film 308, such as gold (Au) or platinum (Pt) that will be patterned to form a first plurality of nanowires in an electrode array. Optionally, the step 3.3 includes the deposition of an adhesion layer, such as a thin layer of titanium metal (Ti) prior to the deposition of the gold and platinum, whereas metals such as Ni, Mo, Cu, and Al do not require an adhesion layer when deposited on a substrate such as silicon having a thermal oxide grown thereon. In some embodiments, e-beam evaporation is used to deposit the Au film 308 with an adhesion layer. FIG. 3(d) depicts the structure after the metal film 308 has been deposited.

At step 3.4, a lift-off process, for example using acetone, is used in order to remove a soluable resist and any overcoated metal and any adhesion layers, leaving in place the first layer of the nanowire array. FIG. 3(e) shows the structure of the first plurality of first electrodes 308 in an array on the substrate 302. The first plurality of first electrodes 308 protrude above the upper surface of the insulator 304.

At step 3.5, an e-beam patterned resist 310 is provided for use in metal deposition to fabricate the second plurality of nanowires. FIG. 3(f) depicts the structure of the e-beam patterned resist 310 deposited over the first plurality of first electrode nanowires 308.

At step 3.6, a second plurality of second electrodes in an array configuration is deposited. A different (second) adhesion layer material (for example, Cr, Ge, or Ni) is used for the second array of nanowires 314 than was used for that of the first nanowire array 308. The nanowires in the second plurality of second electrodes can comprise Au, Pt, or other suitably conductive and unreactive metals. The adhesion layer for the second array of nanowires 314 will be removed in the final step (that is, the second adhesion layer is also the sacrificial spacer layer 312) and its thickness will determine the vertical gap 318 at the cross junctions between the first plurality of first electrodes 308 in an array configuration and the second plurality of second electrodes 314 in an array configuration. The thickness of the adhesion layer (or sacrificial spacer layer 312), and consequently, the dimension of the gap 318, can be controlled precisely in nanometer scale using ultra thin film growth methods (e.g., electron beam evaporation or sputter deposition). FIG. 3(g) depicts the deposited adhesion/sacrificial spacer layer 312 and the second plurality of second electrodes in an array 314, as well as adhesion layer material and excess electrode metal 315 that will be removed during the lift-off process. The sacrificial spacer layer 312 has a bottom surface and a top surface as shown in FIG. 3(g). In various embodiments, the thickness of the sacrificial spacer layer 312 can be as thin as one or two atomic layers (less than 1 nanometer, or 10 angstroms) to dimensions of tens of nanometers. While it is possible to deposit one or two atomic layers of the film, it is generally a good idea to deposit at least a few atomic layers to ensure the formation of a continuous film. In some embodiments, sacrificial spacer layers 312 having thicknesses of less than 10 nanometers (m) have been fabricated. As shown in FIG. 3(g), in one embodiment, the length dimension in the lithographic pattern that defines the second plurality of nanowires 314 is orthogonal to the length direction of the first plurality of nanowires 308.

At step 3.7, a lift-off process is used to remove the resist 310 along with the adhesion layer 312 and the metal 315 that was deposited on top of the resist 310, leaving the second plurality of nanowire electrodes 314 in an array, as shown in FIG. 3(h).

Processes similar to the processes of step 2.9 and 2.10 described above can then be applied to the structure of FIG. 3(h), so as to form an anchor mesh similar to mesh 216 that will support the second plurality of nanowire electrodes 314 in an array. Etching can be used to remove the sacrificial spacer layers 312 to produce a nanogap between surfaces of individual wires 308 and 314 in the first and second pluralities of electrodes in array configuration. The gap is a separation distance between surfaces of the individual nanowires 308 and 314 in the first and second pluralities of electrodes. The dimension of the gap is defined by the thickness of the sacrificial spacer layer 312. To the extent that the sacrificial spacer layer 312 is uniform in thickness, the gaps between surfaces of different pairs of nanowires 308, 314 in the first and second pluralities of electrodes will be uniform or constant.

Still another method for producing a three dimensional structure comprising two arrays of nanowire electrodes with a nanometer gap between surfaces of selected electrodes of the first plurality and surfaces of selected electrodes of the second plurality is to make two arrays of electrodes, and to position one relative to the other in a machine such as a scanning probe microscope. While such an array can in principle be constructed, there are likely to be problems maintaining parallel orientation of the planes defined by the surfaces of the electrodes, as well as difficulties in wiring a structure that can be dynamically positioned.

Figure 4A:
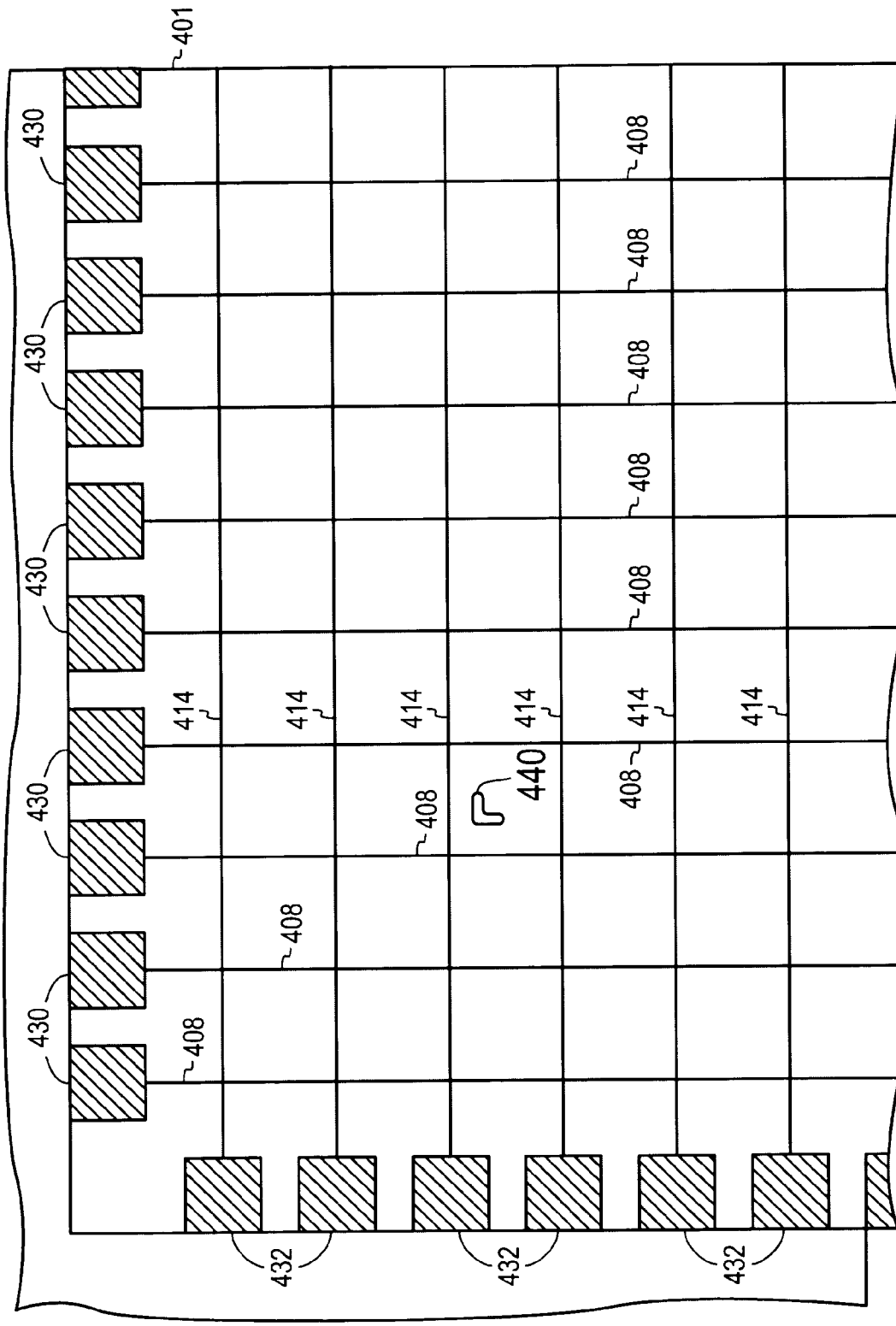
FIGS. 4($a$) and 4($b$) are optical images of a nano-gap electrode array structure comprising 50 nanometer nanowires and having contact pads, according to principles of the invention.
Figure 4B:
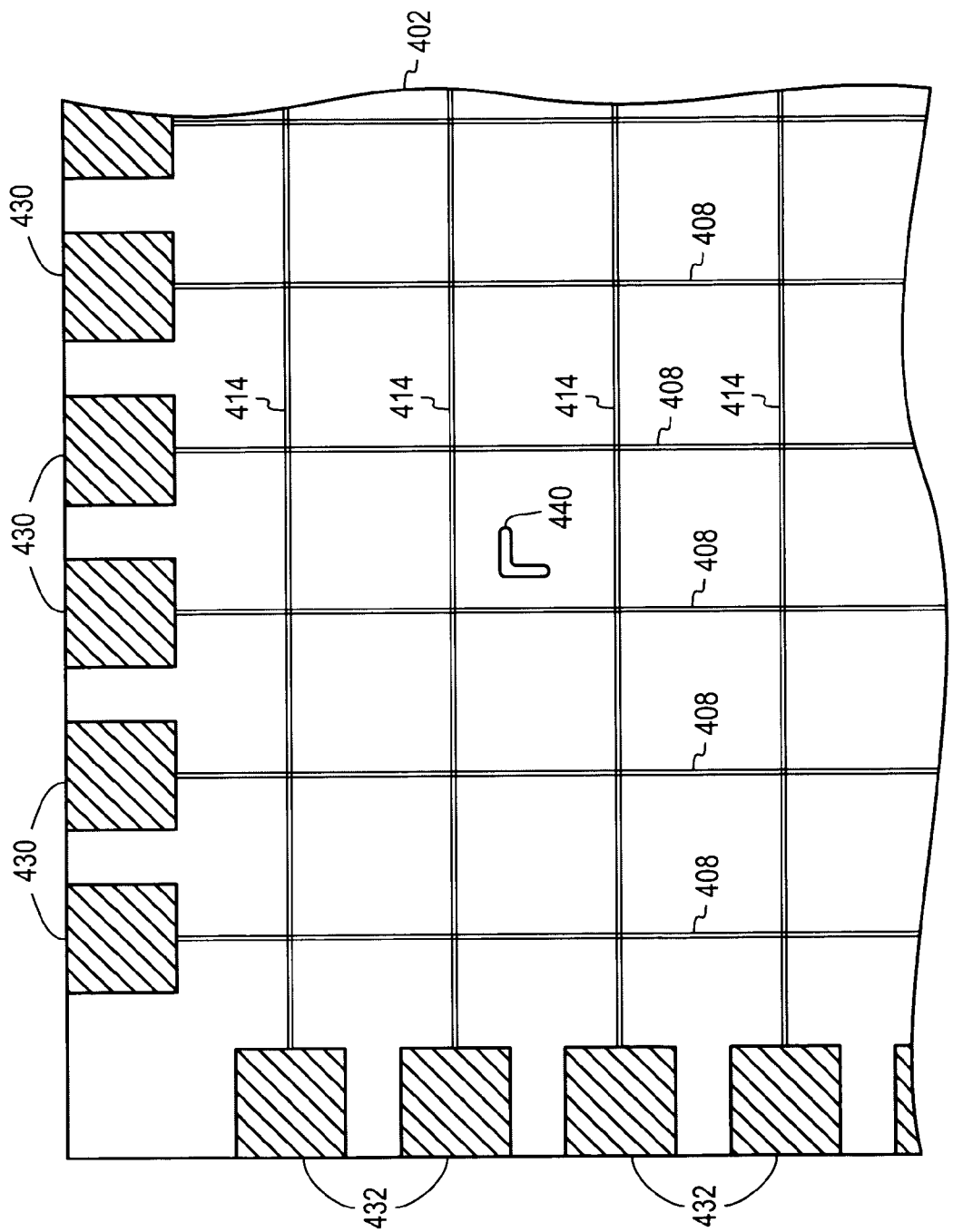

In order to make the nano-gap electrode structure fabricated by any of the fabrication process described above convenient to use, one can provide electrical connection contacts connected to the first plurality of first electrodes and the second plurality of second electrodes. The electrical connection contacts can be made in any convenient size or configuration, such as contact pads, solder pads or wires, or electrical connectors of a type for mating to another electrical device, such as a circuit board, a microprocessor-based signal processor, an analytical instrument, or a control circuit for controlling the operation of the nano-gap electrode array. FIGS. 4(a) and 4(b) are optical images 401, 402 of a nano-gap electrode array structure comprising 50 nanometer nanowires 408, 414 and having contact pads. FIG. 4(a) is an image taken at lower magnification than the image shown in FIG. 4(b). In each image, one sees a region of a nano-gap electrode array structure comprising a first plurality of first electrodes 408 and a second plurality of second electrodes 414 in mutually orthogonal orientation, with contact pads 430 forming the electrical connection contacts electrically connected to a first end of the electrodes of the first plurality 408, and with contact pads 432 electrically connected to a first end of the electrodes of the second plurality 414. A fiduciary mark 440 appears in both of FIGS. 4(a) and 4(b), which fiduciary mark is useful for aligning the processing of successive layers of resist.

Figure 5A:
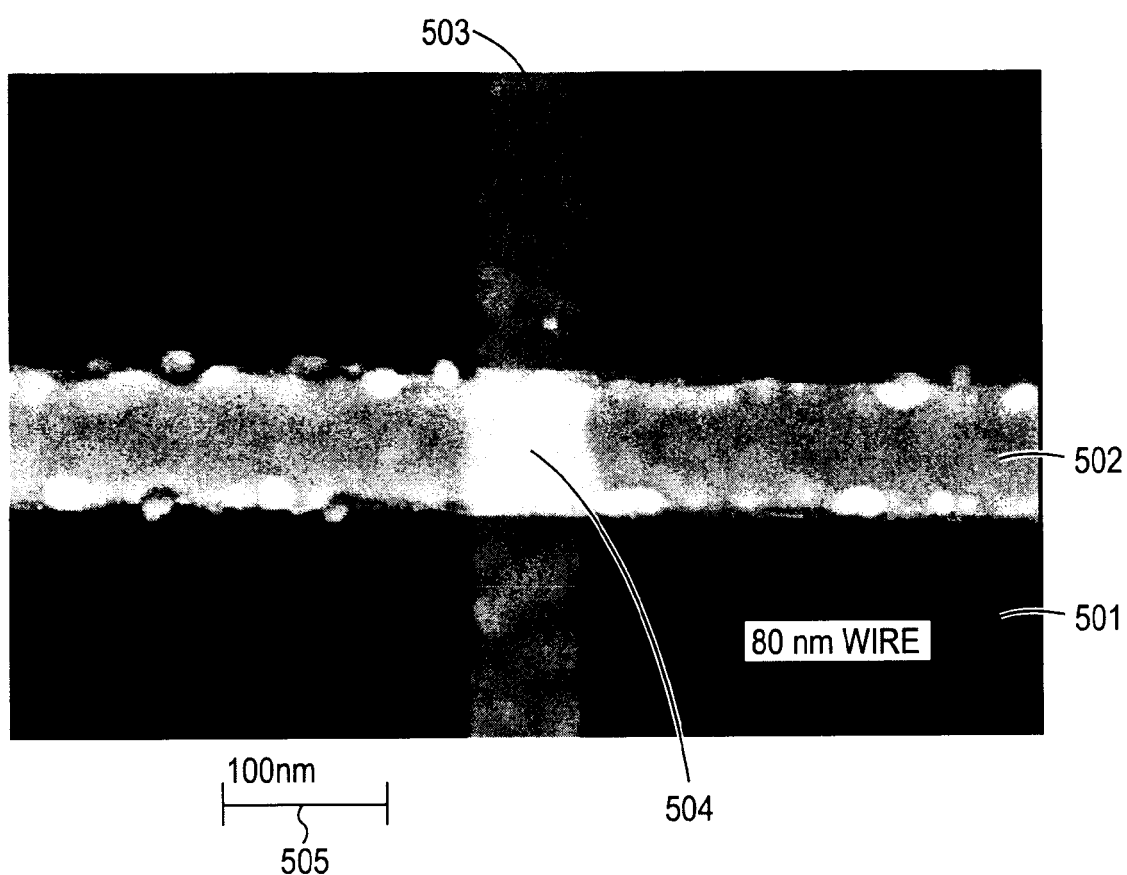
FIGS. 5($a$), 5($b$), and 5($c$) are scanning electron microscope (SEM) images of portions of nano-gap electrode array structures comprising 80 nm wire (5($a$)), 60 nm wire (5($b$)), and 30 nm wire (5($c$)), respectively, according to principles of the invention.
Figure 5B:
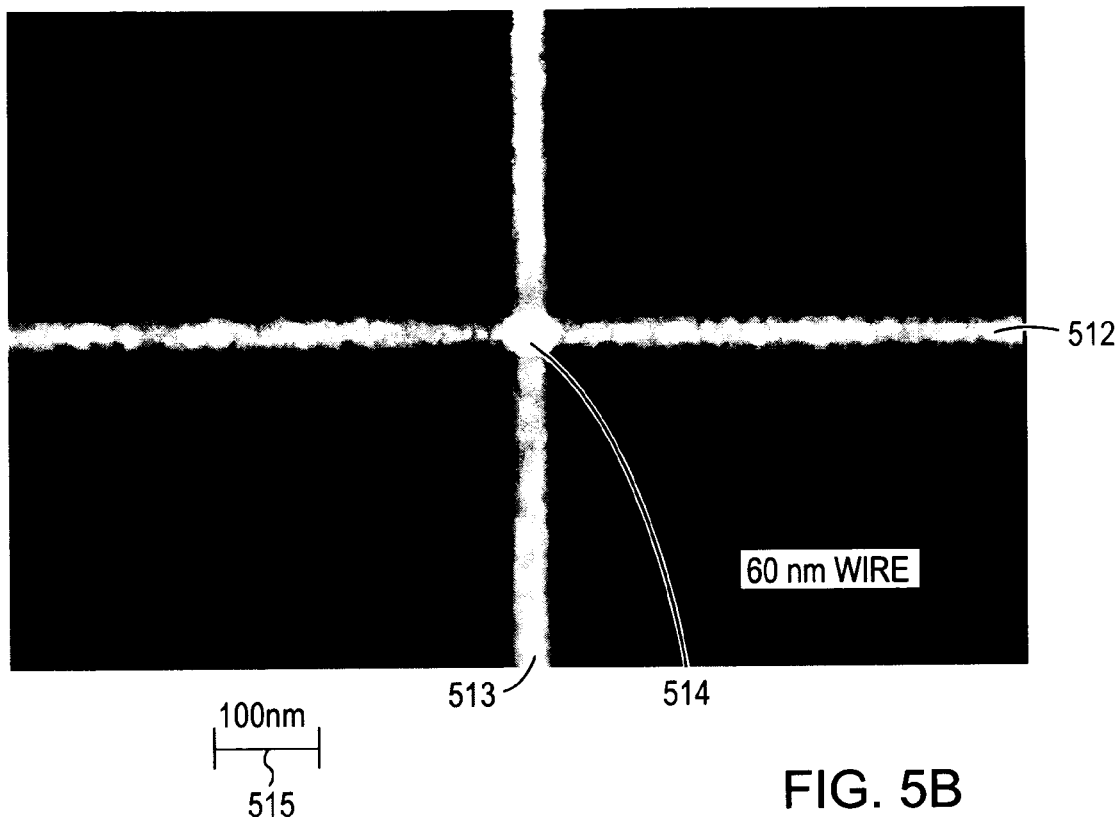
Figure 5C:
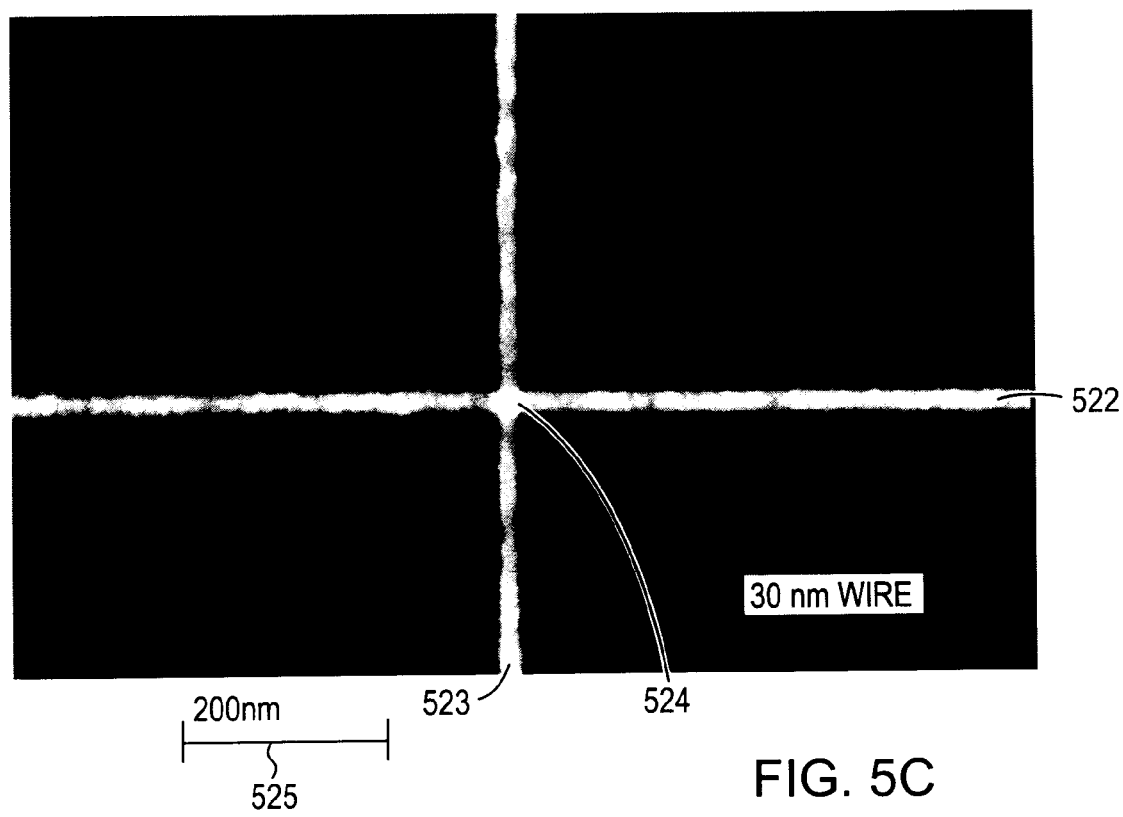

FIGS. 5(a), 5(b), and 5(c) are scanning electron microscope (SEM) images of portions of nano-gap electrode array structures comprising substantially 80 nm wire (5(a)), substantially 60 nm wire (5(b)), and substantially 30 nm wire (5(c)), respectively. FIG. 5(a) is an image 501 that depicts nanowires 502 and 503 having substantially orthogonal orientation. FIG. 5(a) depicts a region 504 where nanowires 502 and 503 cross, which region represents the nano-gap between the crossed nanowires. A 100 nm scale 505 is shown in FIG. 5(a) for comparison with the nanowires. FIGS. 5(b) and 5(c) depict similar structures, differing in the dimensions of the nanowires used to fabricate the array. FIG. 5(b) depicts a region 514 where nanowires 512 and 513 cross, which region represents the nano-gap between the crossed nanowires. A 100 nm scale 515 is shown in FIG. 5(b) for comparison with the nanowires. FIG. 5(c) depicts a region 524 where nanowires 522 and 523 cross, which region represents the nano-gap between the crossed nanowires. A 200 nm scale 525 is shown in FIG. 5(c) for comparison with the nanowires.

Figure 5D:
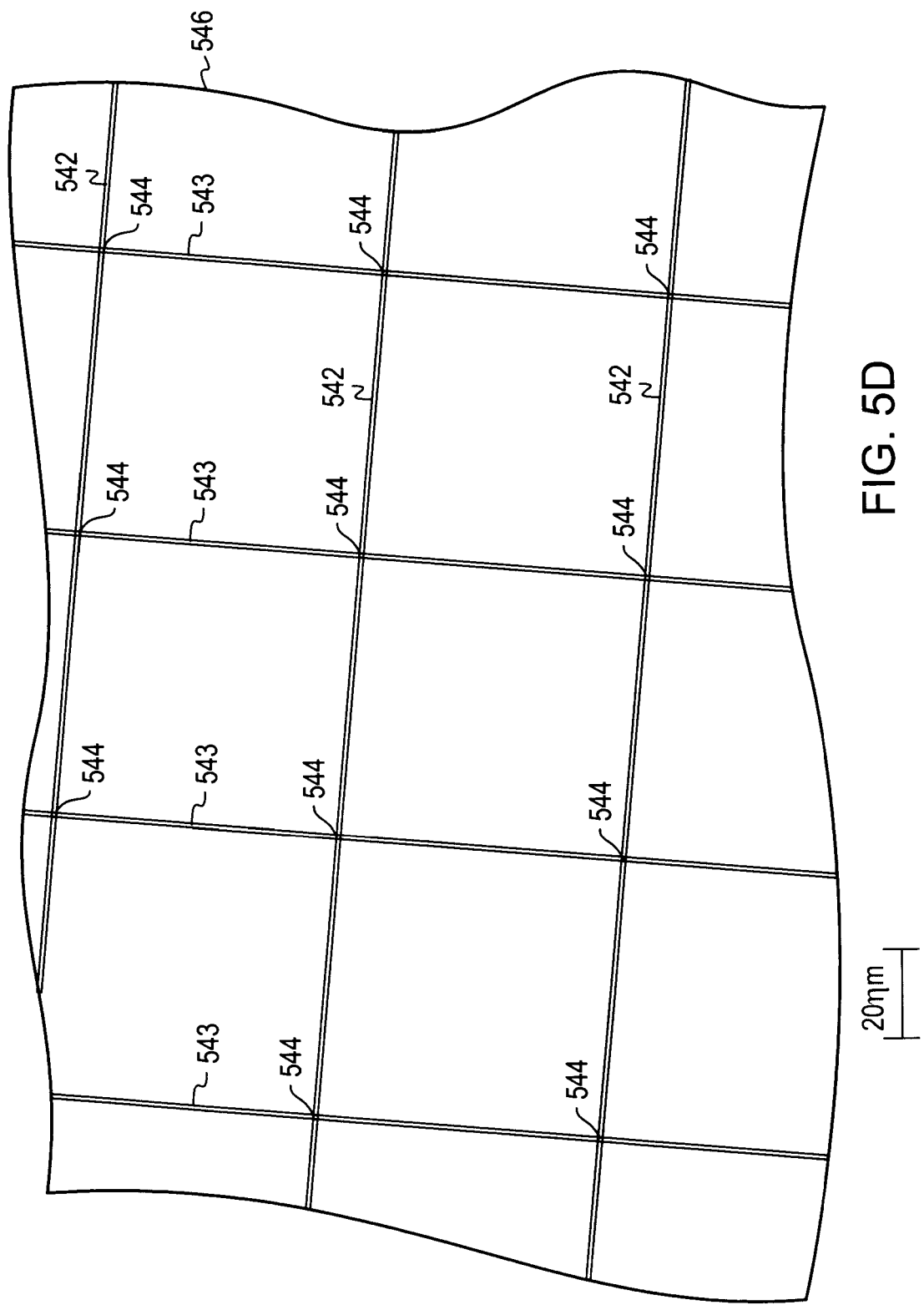

FIG. 5(d) is a scanning electron microscope (SEM) image 540 at low magnification, showing a region of a nano-gap electrode array structure comprising a first plurality of first electrodes (nanowires) 542 and a second plurality of second electrodes (nanowires) 543 in mutually orthogonal orientation. The intersections 544 of electrodes 542 of the first plurality and electrodes 543 of the second plurality define nano-gaps as described herein, which are similar to the regions 504, 514, 524 described above. A 20 μm (micrometer) scale 545 is provided for comparison.

FIG. 6(a) is a schematic diagram 600 of a test circuit comprising an electrode pair comprising two nanowires having 200 nm widths 602, 604, oriented orthogonally to each other and having a gap of substantially 5 nm, which electrode pair is connected to a power supply indicated by the symbol 620.

FIG. 6(b) is a graph 610 of the current normally observed to flow across the electrode pair as a function of applied voltage when tested using a circuit such as that of FIG. 6(a), with no electrically active substance deliberately placed in the 5 nm gap. The current/voltage characteristic is represented by curves 612, 614. The vertical axis 616 of FIG. 6(b) is given in units of Amperes, and shows typical current flows of the order of less than $1 \times 10^{-9}$ Ampere (1 nanoAmp). The horizontal axis of FIG. 6(b) is given in units of Volts.

Figure 6C:
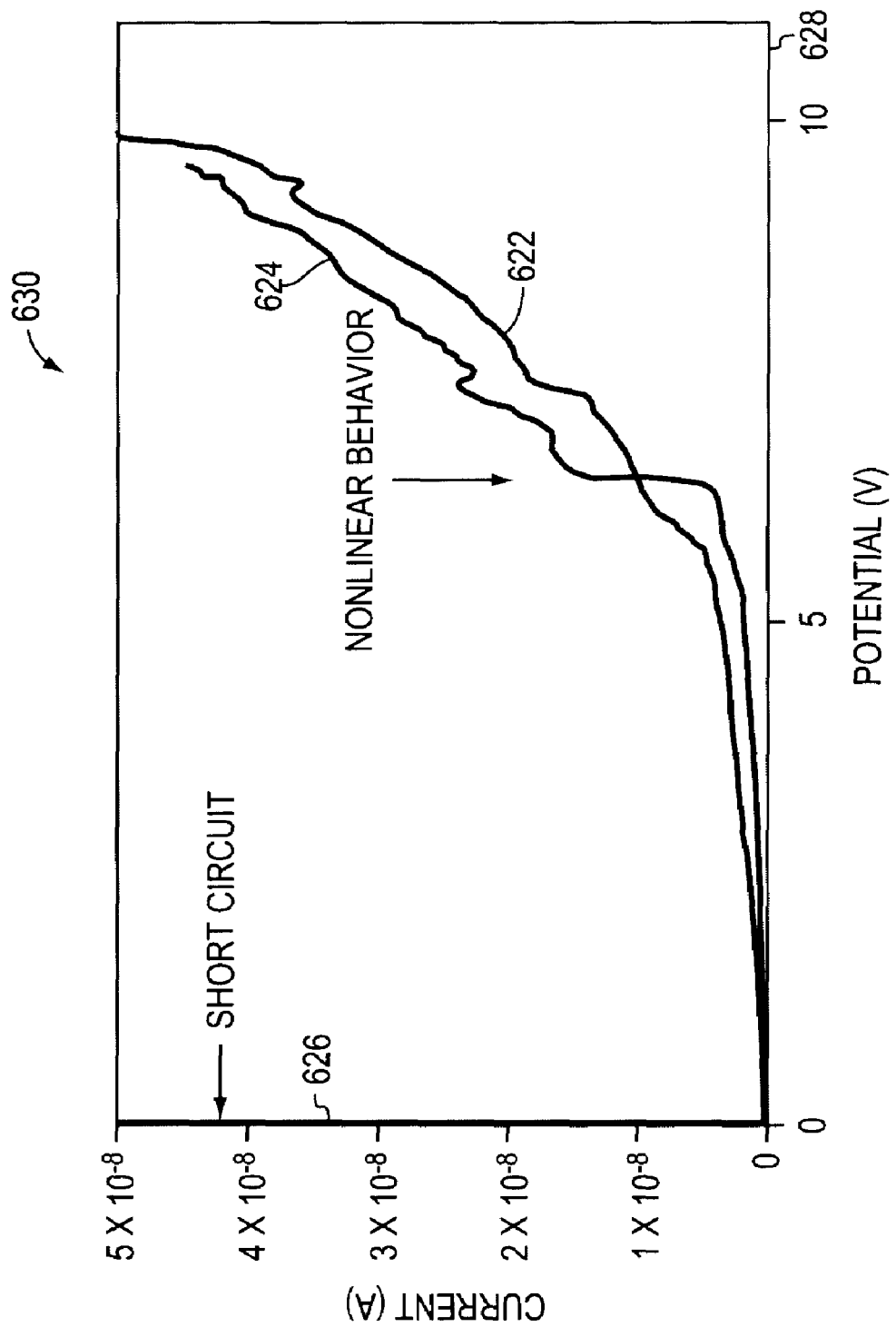
FIG. 6($a$) is a schematic diagram of a test circuit comprising an electrode pair comprising two nanowires having 200 nm widths, oriented orthogonally to each other and having a gap of substantially 5 nm, according to principles of the invention.

FIG. 6(c) is a second graph 630 depicting anomalous current flows 624, 626 observed across the electrode pair as a function of applied voltage when tested using a circuit such as that of FIG. 6(a), with no electrically active substance deliberately placed in the 5 nm gap. The non-linear behavior of curve 624, and the behavior of curve 626 (corresponding to substantially short circuit conditions that superimpose on the vertical axis) are seen in a small fraction of fabricated electrodes, and are thought to represent shorting as a result of bending of the nanowires under large enough applied voltage. The vertical axis 626 of FIG. 6(c) is given in units of Amperes, and shows anomalous current flow of the order of some units of $10^{-8}$ Ampere (10 nanoAmp), more than ten times larger than the current flows observed in FIG. 6(b). The horizontal axis of FIG. 6(c) is given in units of Volts.

While the present invention has been particularly shown and described with reference to the structure and methods disclosed herein and as illustrated in the drawings, it is not confined to the details set forth and this invention is intended to cover any modifications and changes as may come within the scope and spirit of the following claims.

What is claimed is:

1. A method of fabricating a nano-gap electrode structure in an array configuration, comprising the steps of:

forming a first plurality of first electrodes in an array, each of said plurality of first electrodes having a first electrode surface;

depositing a sacrificial spacer layer having a first surface and a second surface defining a thickness of said sacrificial spacer layer upon said first electrode surface of at least one of said first electrodes, said first surface of said sacrificial spacer layer adjacent said first electrode surface of said first electrode;

forming a second plurality of second electrodes in an array, each of said plurality of second electrodes having a first electrode surface, said second surface of said sacrificial spacer layer adjacent said first surface of at least one of said second plurality of second electrodes; and removing at least that portion of said sacrificial spacer layer having said first surface of said sacrificial spacer layer adjacent said first electrode surface of a selected one of said first plurality of first electrodes and said second surface of said sacrificial spacer layer adjacent said first electrode surface of at least one of said second plurality of second electrodes;

whereby said first electrode surface of said selected one of said first plurality of first electrodes and said first electrode surface of at least one of said second plurality of second electrodes define an electrode gap having a dimension substantially equal to said thickness of said portion of said sacrificial spacer layer that was removed, said first electrode surface of said selected one of said first plurality of first electrodes and said first electrode surface of at least one of said second plurality of second electrodes configured to maintain said electrode gap dimension in response to an application of an electrical signal of sufficient magnitude to operate said three-dimensional nano-gap electrode structure in an array configuration.

2. A three-dimensional nano-gap electrode structure in an array configuration, comprising:

a first plurality of first electrodes in an array, each of said plurality of first electrodes having a first electrode surface; and a second plurality of second electrodes in an array, each of said plurality of second electrodes having a first electrode surface, a first surface of at least one of said first plurality of first electrodes disposed at a separation distance from said first electrode surface of a selected one of said second plurality of second electrodes, said separation distance defined by a void resulting from removal of a sacrificial material, said separation distance being measured in a direction perpendicular to at least one of said first electrode surface of said first electrode and said first electrode surface of said second electrode, said first plurality of first electrodes and said second plurality of second electrodes configured to maintain said separation distance in response to an application of an electrical signal of sufficient magnitude to operate said three-dimensional nano-gap electrode structure in an array configuration;

whereby said first electrode surface of one of said first plurality of first electrodes and said first electrode surface of one of said second plurality of second electrodes define a three-dimensional structure.

3. The three-dimensional nano-gap electrode structure in an array configuration of claim 2, wherein said separation distance has a dimension of less than 10 nm.

4. The three-dimensional nano-gap electrode structure in an array configuration of claim 3, wherein said separation distance has a dimension of less than 5 nm.

5. The three-dimensional nano-gap electrode structure in an array configuration of claim 2, further comprising a substrate for supporting said three dimensional nano-gap electrode structure.

6. The three-dimensional nano-gap electrode structure in an array configuration of claim 5, wherein said substrate is a semiconductor material.

7. The three-dimensional nano-gap electrode structure in an array configuration of claim 6, wherein said semiconductor material is silicon.

8. The three-dimensional nano-gap electrode structure in an array configuration of claim 2, further comprising an insulator layer upon said substrate for electrically insulating at least one electrode of said nano-gap electrode structure from said substrate.

9. The three-dimensional nano-gap electrode structure in an array configuration of claim 2, further comprising electrical connection contacts connected to said first plurality of first electrodes and said second plurality of second electrodes, said electrical connection contacts configured to provide convenient electrical communication between said nano-gap electrode structure and another electrical device.

10. The three-dimensional nano-gap electrode structure in an array configuration of claim 2, further comprising a lattice structure that mechanically supports at least one of said first plurality of first electrodes and said second plurality of second electrodes.

11. The three-dimensional nano-gap electrode structure in an array configuration of claim 2, wherein at least one of said first plurality of first electrodes in an array and at least one of said second plurality of second electrodes in an array are disposed relative to one another in an orthogonal orientation.

12. A method of fabricating the nano-gap electrode structure of claim 2, comprising the steps of:
   forming a first plurality of first electrodes in an array, each of said plurality of first electrodes having a first electrode surface;
   depositing a sacrificial spacer layer having a first surface and a second surface defining a thickness of said sacrificial spacer layer upon said first electrode surface of at least one of said first electrodes, said first surface of said sacrificial spacer layer adjacent said first electrode surface of said first electrode;
   forming a second plurality of second electrodes in an array, each of said plurality of second electrodes having a first electrode surface, said second surface of said sacrificial spacer layer adjacent said first electrode surface of at least one of said second plurality of second electrodes; and
   removing at least that portion of said sacrificial spacer layer having said first surface of said sacrificial spacer layer adjacent said first electrode surface of a selected one of said first plurality of first electrodes and said second surface of said sacrificial spacer layer adjacent said first electrode surface of at least one of said second plurality of second electrodes;
   whereby a structure according to claim 15 is produced wherein said first electrode surface of said selected one of said first plurality of first electrodes and said first electrode surface of at least one of said second plurality of second electrodes define an electrode gap having a dimension substantially equal to said thickness of said portion of said sacrificial spacer layer that was removed.

13. The method of fabricating a nano-gap electrode structure in an array configuration according to claim 12, further comprising the step of:
   providing a substrate for supporting said nano-gap electrode structure.

14. The method of fabricating a nano-gap electrode structure in an array configuration according to claim 13, further comprising the step of:
   providing a first adhesion layer between said substrate and at least one of said first plurality of first electrodes.

15. The method of fabricating a nano-gap electrode structure in an array configuration according to claim 14, wherein said first adhesion layer and said sacrificial spacer layer comprise a different material composition.

16. The method of fabricating a nano-gap electrode structure in an array configuration according to claim 13, wherein said substrate is a semiconductor material.

17. The method of fabricating a nano-gap electrode structure in an array configuration according to claim 16, wherein said semiconductor material is silicon.

18. The method of fabricating a nano-gap electrode structure in an array configuration according to claim 13, further comprising the step of:
   providing an insulator layer upon said substrate for electrically insulating at least one electrode of said nano-gap electrode structure from said substrate.

19. The method of fabricating a nano-gap electrode structure in an array configuration according to claim 12, further comprising the step of:
   defining a dimension of at least one of said first plurality of first electrodes in an array and said second plurality of second electrodes in an array by lithographic methods.

20. The method of fabricating a nano-gap electrode structure in an array configuration according to claim 19, wherein said dimension is a selected one of a width of a selected electrode, a separation between two adjacent electrodes in said first plurality of first electrodes, and a separation between two adjacent electrodes in said second plurality of second electrodes.

21. The method of fabricating a nano-gap electrode structure in an array configuration according to claim 12, further comprising the step of:
   defining a relative orientation between at least one of said first plurality of first electrodes in an array and at least one of said second plurality of second electrodes in an array by lithographic methods.

22. The method of fabricating a nano-gap electrode structure in an array configuration according to claim 21, wherein said relative orientation is an orthogonal orientation.

23. The method of fabricating a nano-gap electrode structure in an array configuration according to claim 12, further comprising the step of:
   forming a lattice structure that mechanically supports at least one of said first plurality of first electrodes and said second plurality of second electrodes.

24. The method of fabricating a nano-gap electrode structure in an array configuration according to claim 12, further comprising the step of:
   providing electrical connection contacts connected to said first plurality of first electrodes and said second plurality of second electrodes, said electrical connection contacts configured to provide convenient electrical communication between said nano-gap electrode structure and another electrical device.

25. The method of fabricating a nano-gap electrode structure in an array configuration according to claim 12, wherein said thickness of said sacrificial spacer layer is less than ten nanometers.

* * * * *